United States Patent
London

(10) Patent No.: US 8,207,634 B2
(45) Date of Patent: Jun. 26, 2012

(54) COMPACT MULTI-CYCLE HIGH POWER MICROWAVE GENERATOR

(75) Inventor: Simon Y. London, Rockville, MD (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 347 days.

(21) Appl. No.: 12/697,449

(22) Filed: Feb. 1, 2010

(65) Prior Publication Data

US 2010/0194208 A1 Aug. 5, 2010

Related U.S. Application Data

(60) Provisional application No. 61/148,643, filed on Jan. 30, 2009.

(51) Int. Cl.
*H03K 3/64* (2006.01)
*H04B 3/04* (2006.01)

(52) U.S. Cl. .......................................... 307/106; 333/20
(58) Field of Classification Search .................. 307/106, 307/108; 333/20
See application file for complete search history.

(56) References Cited

U.S. PATENT DOCUMENTS

| | | |
|---|---|---|
| 2,792,508 A | 5/1957 | Samsel |
| 3,484,619 A | 12/1969 | Proud |
| 4,127,748 A | 11/1978 | Gillemot |
| 4,127,784 A | 11/1978 | Proud |
| 4,491,842 A | 1/1985 | Gripshover |
| 5,109,203 A | 4/1992 | Zucker |
| 5,153,442 A | 10/1992 | Bovino |
| 5,185,586 A | 2/1993 | Zucker |
| 5,650,670 A | 7/1997 | Thaxter |
| 7,268,641 B2 * | 9/2007 | Zucker et al. ................... 333/20 |

(Continued)

FOREIGN PATENT DOCUMENTS

RU 2258301 8/2005

(Continued)

OTHER PUBLICATIONS

Proud and Norman, IEEE Transactions on Microwave Theory and Techniques, vol. MTT-26, No. 5, Mar. 1978, pp. 137-140.

(Continued)

*Primary Examiner* — Michael Rutland Wallis
(74) *Attorney, Agent, or Firm* — Sean P. O'Hanlon

(57) ABSTRACT

A compact multi-cycle high power microwave generator and a method of using the generator to generate microwave signals is disclosed and claimed. The apparatus includes one or more charged transmission line sections. Each transmission line section includes a first conductor that is section-specific and a second conductor that is common to all of the sections. A switch is associated with each section, each switch being operatively connected to a respective one of the first conductors. The apparatus includes third, common conductor that is not charged and that is operatively connected to each of the first conductors through its respective switch. The apparatus further includes a load, with the second conductor, the third conductor, and the load being operatively connected. Thus, the number of section-specific conductors, the number of charged transmission line sections, and the number of switches are all equal. Engagement of the switches generates a multi-cycle microwave pulse. Aspects, such as wavelength, frequency, and spacing, of the generated wave forms can be varied by including non-charged transmission lines intermediate the transmission line sections or varying the lengths of individual transmission line sections or varying the switching time.

20 Claims, 17 Drawing Sheets

U.S. PATENT DOCUMENTS

| | | | |
|---|---|---|---|
| 7,365,615 B2 | 4/2008 | Zucker | |
| 7,633,182 B2 * | 12/2009 | London | 307/106 |
| 2007/0040623 A1 | 2/2007 | London | |

FOREIGN PATENT DOCUMENTS

| | | |
|---|---|---|
| RU | 2313900 | 12/2007 |
| SU | 852135 | 4/1983 |

OTHER PUBLICATIONS

Gripshover, "Frozen-Wave Hertzian Generators-Theory and applications" presented at the 2nd International Pulsed Power Conference in 1979.

* cited by examiner

COMPACT MULTI-CYCLE HIGH POWER MICROWAVE GENERATOR

CROSS-REFERENCE TO RELATED APPLICATIONS

This application claims the benefit of U.S. Provisional Patent Application No. 61/148,643 filed on Jan. 30, 2009, which is incorporated herein by reference in its entirety.

BACKGROUND OF THE INVENTION

1. Field of the Invention

The present invention relates to a method and apparatus for generating microwaves and, more particularly, the present invention relates to a microwave source and method for generating a train of bipolar pulses.

2. Description of the Related Art

High power microwave (HPM) pulse generators for radiating purposes should generate bipolar pulse(s) due to the absence of non-radiated dc and low-frequency components at their frequency spectrum. With respect to the number of generating pulses and corresponding basic structures, HPM pulse generators are divided in two categories:
1. Monocycle (Single Bipolar pulse) Generators
2. Multi-cycle (Train of Bipolar pulses) Generators The best multi-cycle waveform, especially for radiation, is a sequence of bipolar pulses (rectangular positive and negative sub-pulses) with high peak power of each monocycle and with high energy due to the number of cycles.

From the generator's structure point of view, the best results in pulse forms can be achieved by using voltage charged transmission lines and discharging them by fast switches (spark-gaps or various solid-state switches, including photonically controlled ones).

There are several main criteria that characterize the quality of architecture/circuit of multi-cycle pulse generators:
1. Compactness: acceptance of folded design, etc
2. Number of switches for specified number of pulses and their forms
3. Holding voltage on switches relative to the line's charging voltage(s)
4. Available pulse forms There are two different categories of multi-cycle generators, based on the principle of operation: Sequentially Switching Generators (SSG) and Frozen-wave Generators (FWG). In a SSG, the switches are closed sequentially with specific time delays depending on the electrical length of the corresponding transmission lines and the required pulse waveform. In a FWG, the switches are closed at the same time and instantly start the discharged process of all transmission lines. This process provides a predominated multi-cycle pulse train on the load.

Most commonly used multi-cycle HPM generators have the same structure for both principles of operation. The main differences are the timing in the closing of all switches and the number of pulses relative to the number of switched lines and associated switches.

FIGS. 1a and 1b illustrate sequentially switched pulse generator with equal pulse's width. For this pulse generator, each line's section produces a positive or negative sub-pulse depending on polarity of the charging voltage. Generated pulses could be with specified different widths depending on electrical length of corresponding lines. Switching time should be changed accordingly. In this generator with sequentially switching, each switch provide generating only one sub-pulse, i.e. for N bipolar pulses 2N switches is required.

For a FWG, the situation is different. FIG. 2a illustrates six-section switchable transmission line FWG having six switches connected in series between sections and one switch connected in parallel to the first section. FIG. 2b illustrates the generated pulse train. Variations of electrical lengths of sections give some freedom in variations of pulses widths and frequency spectrum of generating pulse train. FIG. 3a illustrates a schematic diagram of an exemplary known FWG with six sections and with the switches positioned only in series with the transmission line sections. FIG. 3b shows an ideal five and halve-cycle pulse form on matched load of the generator according to FIG. 3a.

In the presented multi-cycle generators on FIG. 1a, and FIG. 2a, all switches except for one switch on FIG. 2a, which is connected in parallel to the first transmission line section, should handle double charging voltage. This is a serious limitation for switch selection.

In a few very nearly "Frozen-Wave"—type generators, the number of switches with holding voltages still equal to double the charging voltage(s) could be lower than the number of generating bipolar pulses. However, in these cases the negative effects of switch resistance (Rsw) and switch inductance (Lsw) raise drastically with a decrease in the number of switches.

Modern trends in High Power Microwave (HPM) pulse generators, which can be used for a variety of applications, are directed to increasing power and efficiency as well as the energy density (energy per volume). Pulse generators based on voltage charged transmission lines can achieve some of the best results, especially in the case of generating a series of bipolar pulses (series of cycles), i.e. a pulse train. The coupling of the resulting pulse train to a load, such as an antenna, results in the radiation of a short HPM pulse. This approach has been investigated for over 30 years.

Known multi-cycle microwave generators based on charged transmission lines are not compact due to their schematics/structures. In one group of these generators with acceptable number of switches, holding voltages on these switches are equal to double of charging voltages. Another group of generators with holding voltages on switches that are equal to charging voltages, required many switches (at least two switches per one generating cycle-bipolar pulse). All of these generators are not compact. The main problem consists in developing a simple Multi-Cycle Microwave Generator with charged transmission lines, which is compact, required small amount of switches (not more than the number of generating cycles), and with minimum holding voltages on switches that is equal to charging voltages. Structure(s) should allow generate high-power pulses.

Proud, in U.S. Pat. No. 3,484,619, discusses a SSG arrangement for generating a train of bipolar pulses by sequentially switching oppositely charged transmission line sections by using closing switches, as illustrated schematically in FIGS. 4a and 4b. Zucker et al., in U.S. Pat. No. 5,109,203, also discusses multi-cycle HPM generator structure with various SSG design options and with light activated fast photoconductive closing switches. An additional impedance transformation by non-uniform transmission line is presented. Similar structure is presented by Zucker in U.S. Pat. No. 5,185,586. Remnev, in SU Patent No. 852135, also discusses a similar multi-cycle HPM generator structure with sequentially switching spark-gaps.

All three of these known generators have the same basic circuit (shown in FIG. 4), which suffers from disadvantages, for example: the design is not compact, the required hold-off voltage on each switch is large—equal to double the charging voltage on each transmission line, two switches are required for generating a bipolar pulse (cycle) (i.e., the total number of switches is twice the number of generating cycles), and switches connected in series introduce considerable losses.

Zucker and London, in U.S. Pat. Nos. 7,268,641 and 7,365,615, discuss a SSG arrangement for generating a train of bipolar HPM pulses by sequential switching of closing switches positioned in parallel to transmission line sections. In such a design, the hold-off voltage on each switch is equal only to the charging voltage. This is illustrated schematically in FIG. 5. Moreover, all switches are no longer positioned on the power flow way and, therefore, their losses are not critical and the number of sections is limited mostly by the conductive losses on transmission lines, i.e., by efficiency. Each switch should handle just the charging voltage before discharging, and slightly more during discharging time. This design is not compact, especially in the case of using strip transmission lines and very short pulses (around 1-2 ns). Furthermore, two switches are required for generating one cycle.

London, in U.S. Patent Application Publication No. 2007/0040623, discusses different SSG arrangements for generating a train of bipolar pulses when the switches are also positioned in parallel to transmission line sections. Additionally, there are lower conductive losses in transmission line sections by eliminating conductors with equal magnitude and oppositely directed currents at both sides of oppositely charged transmission line sections. This is illustrated schematically in FIG. 6.

In all known design variations of these sequential switching generators, at least two switches are required for generating one bipolar pulse (mono-cycle). In the generator shown in FIG. 6, four switches in two successive balanced stages provide generation of a single bipolar pulse. With respect to the generator shown in FIG. 5, the number of switches is double and the power/energy of each pulse is also double with the same physical/electrical length of generator. All of these sequential switching generators are also not compact.

Bovino et al., in U.S. Pat. No. 5,153,442, discuss an arrangement for generating a train of bipolar pulses by sequentially switching oppositely charged transmission lines using closing-opened switches between each transmission line and the common load. Again, however, the design is not compact and two switches are required for generating one bipolar pulse (cycle). Additionally, this design requires fast switches with specific opening time.

Multi-cycle HPM generators, which termed Frozen Wave Generators (FWG), have a basic schematic similar to that shown in FIG. 4. In these generators, all switches should be closed simultaneously and each switch provides generation of one bipolar pulse. Proud, in U.S. Pat. No. 4,127,748, discusses a FWG arrangement for generating a train of bipolar pulses by simultaneously closing all switches connected in series between oppositely charged transmission line sections, as illustrated schematically in FIGS. 7a and 7b. Proud and Norman, in IEEE Transactions on Microwave Theory and Techniques, vol. MTT-26, No. 5, March 1978, pp. 137-140, present some details concerning the operation of FWG with light activated semiconductor switches. Many other papers illustrate the operation of specific FWG with photoconductive and other types of switches. The main disadvantages of such implementations of FWG generators include: the design is not compact, the required hold-off voltage on each switch is large—equal to double the charging voltage.

Samsel, in U.S. Pat. No. 2,792,508 discusses an arrangement for generating multi-cycle waves by using two groups of interconnected, oppositely charged transmission line sections, two blocking capacitors, and one closing switch. This design, however, has a complicated, non-compact structure. This design also requires the hold-off voltage on each switch to be equal to double the charging voltage. Furthermore, this design cannot provide a high repetition rate of generating pulses.

Thaxter, in U.S. Pat. No. 5,650,670, discusses an arrangement for generating high power square wave pulses using charged and non-charged transmission line sections and only one fast switch, which should handle only charging voltage. This generator cannot produce a sequential group of bipolar pulses and, therefore, cannot be used for the purpose of effective radiating as known FWG or SSG architectures. Additionally, negative effects of the switch's resistance and inductance on efficiency and pulse shape are increased due to a relatively large charge transfer through a single switch.

Selemir, Ptitsyn et al., in RU Patent No. 2 258 301, discuss an arrangement for generating a multi-cycle wave using pairs of oppositely charged transmission line sections and only one switch. Again, this design suffers from disadvantages, including: non-compact design, deterioration of the pulse shape due to interconnections between cables—especially for frequently required short pulses, deterioration of the efficiency and pulse shape due to the presence of the capacitor, requirement of a high hold-off voltage equal to the double charging voltage, and high negative effects of the switch's resistance and inductance on efficiency and pulse shape due to a relatively large charge transfer through the switch. Furthermore, in order to achieve high power/energy, parallel connected switches are needed.

FIG. 8 illustrates a schematic/design diagram of an exemplary known three-cycle generator with a single switch.

Ptitsyn, Selemir et al., in RU Patent No. 2 313 900, discuss a similar arrangement as in RU Patent No. 2 258 301, in which the capacitor is replaced by an additional switch. This increases efficiency to some extent and improves pulse shape, but decreases reliability. In addition to the disadvantages discussed above, this design is not preferred for HPM applications for the short pulses and with frequently used strip transmission lines.

Gripshover et al., in U.S. Pat. No. 4,491,842 and in a paper entitled "Frozen-Wave Hertzian Generators-Theory and applications" presented at the 2nd International Pulsed Power Conference in 1979, discuss an arrangement with coaxial cables for generating two-cycle high power pulses with tenth's nanosecond width by using a single switch. This design also suffers from disadvantages mentioned above, for example: non-compact designs, interconnections between cables deteriorate the pulse shape—especially for the frequently required high power short (1-2 ns) pulses especially in the case of low-impedance strip transmission lines, the required hold-off voltage on the switch is equal to double the charging voltage, high negative effects of the switch's resistance and inductance on efficiency and pulse shape due to a relatively large charge transfer through the switch (increases with number of pulses), and parallel connected switches typically are necessary.

A short review of current multi-cycle transmission line pulse generators in conjunction with criteria indicated above shows that there are several needs that will be very important for practical needs to combine together in one multi-cycle HPM generator:

Minimum holding voltage on switches, i.e. equal to charging voltages

Minimization of the number of switches (should not exceed the number of cycles)

Generation of a multi-cycle train with different width of individual cycles (bipolar pulses) to provide broad frequency spectrum The proposed multi-cycle pulse generators with charged/discharged transmission lines obey all of the above mentioned criteria.

The present invention provides solutions to the problems associated with known systems as described above. The present invention provides a compact design for a multi-cycle HPM generator based on voltage charged transmission lines. The present invention also minimizes hold-off voltage on closing switches—equal to the transmission line charging voltage. The present invention also requires a relatively small number of switches. The present invention can provide corrections of the negative effects of the switch's resistance and inductance. The present invention can also provide a balanced (symmetrically positioned) load. The present invention further provides for the production of cycles of various widths to provide the broadband frequency spectrum.

SUMMARY OF THE INVENTION

According to the present invention a compact multi-cycle high power microwave generator is provided by providing a goal-directed interconnection of identical alternately charged two-transmission line sections. Moreover, some variations in width of generating pulses can be achieved for control and increasing the frequency spectrum of the generated pulse train.

The present invention relates to an apparatus for generating electrical impulses and a method of generating the pulses. The apparatus includes one or more charged transmission line sections. Each transmission line section includes a first conductor that is section-specific and a second conductor that is common to all of the sections. Adjacent ones of the plurality of transmission line sections have opposite charges, and may be operatively connected through non-charged transmission lines. The apparatus further includes a number of switches. Each of the first conductors is operatively connected to a switch. That is, each respective section is associated with a unique switch, the switch being operatively connected to that section's first (section-specific) conductor. The apparatus further includes a third conductor that is common to all of the transmission line sections. This third (common) conductor is not charged and is operatively connected to each of the first conductors through its respective switch. The apparatus further includes a load, with the second (common) conductor, the third (common) conductor, and the load being operatively connected. Thus, the number of first (section-specific) conductors, the number of transmission line sections, and the number of switches are all equal. Engaging a switch thus creates a microwave signal.

The load can be operatively connected to a near end of the second conductor and a near end of the third conductor, while the distant ends of the second and third conductors are operatively connected together. Alternatively, the near ends of the second and third conductors can be operatively connected together, and the distant ends of the second and third conductors can be operatively connected together. The load can then be operatively connected to first and second intermediate ends of the second conductor. The impedances of the components can be chosen such that the impedance of the charged transmission line sections, the impedance of any included non-charged connecting transmission lines, and the impedance of the load are all substantially equal.

The transmission line sections can all have the same length, resulting in a multi-cycle generated pulse in which the pulses have the same length. Alternatively, the transmission line sections can be provided with varying lengths, resulting in a multi-cycle generated pulse in which the pulses have different lengths.

The apparatus may further include a plurality of capacitors, each capacitor being operatively connected between the third (common) conductor and the second (common) conductor at interconnections between adjacent transmission line sections to compensate for inductances of the switches.

The apparatus of the present invention may be used to generate microwave signals by charging the transmission line sections with sequentially reversed polarities and closing one of the switches to generate a bipolar pulse. The switches can be selectively closed to generate a multi-cycle bipolar pulse. The switches may all be closed at the same time, or the switches can be closed at different times. Non-charged transmission lines can be provided intermediate select adjacent ones of the plurality of transmission line sections to generate a bipolar pulse having separation between its positive and negative sub-pulses or to generate a multi-cycle bipolar pulse having separation between certain adjacent pulses. The transmission line sections may be provided in different lengths to generate a multi-cycle bipolar pulse in which the sub-pulses have varying lengths.

DESCRIPTION OF THE DRAWINGS

The present invention is described with reference to the accompanying drawings, in which like reference characters reference like elements, and wherein:

FIG. 1b shows an ideal pulse form on the matched load of the generator according to FIG. 1a;

FIG. 2b shows an ideal pulse form with identical cycles on the matched load of the generator according to FIG. 2a;

FIG. 3b shows an ideal five and halve-cycle pulse form on matched load of the generator according to FIG. 3a;

FIG. 4b shows an ideal pulse form on the matched load of the generator according to FIG. 4a;

FIG. 7b shows an ideal six-cycle pulse form on matched load of the generator according to FIG. 7a;

FIG. 16b shows an ideal N-cycle pulse form on the matched load of the generator according to FIG. 16a;

FIG. 19b shows an ideal N-cycle pulse form on the matched load of the generator according to FIG. 19a;

DETAILED DESCRIPTION OF THE INVENTION

Figure 1A:
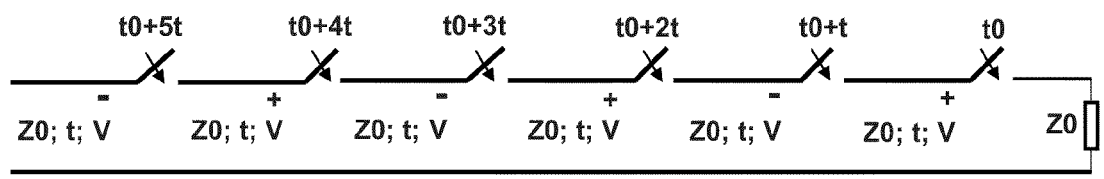
FIG. 1a illustrates a schematic diagram of an exemplary known SSG.
Figure 1B:
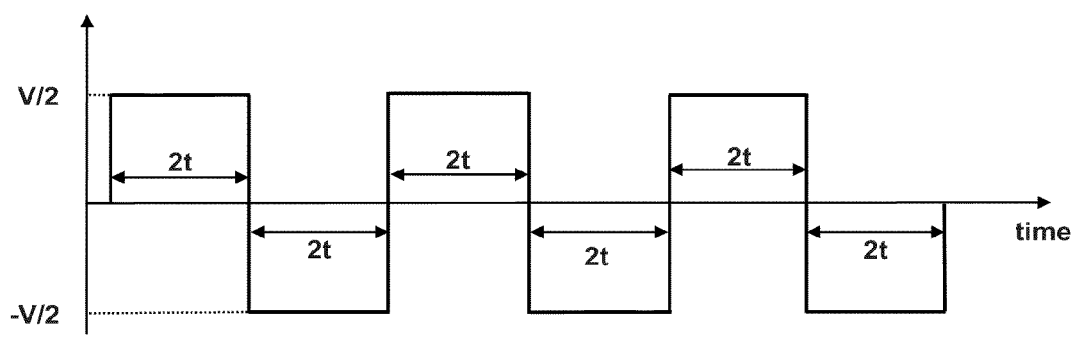
Figure 2A:
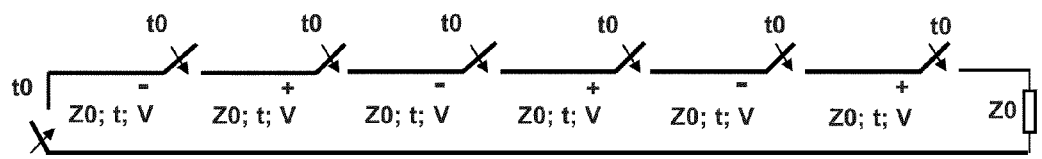
FIG. 2a illustrates a schematic diagram of an exemplary known FWG with six transmission line sections.
Figure 2B:
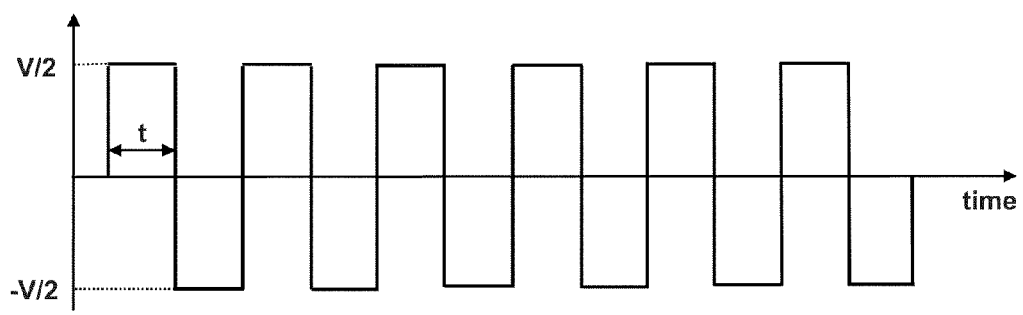
Figure 3A:
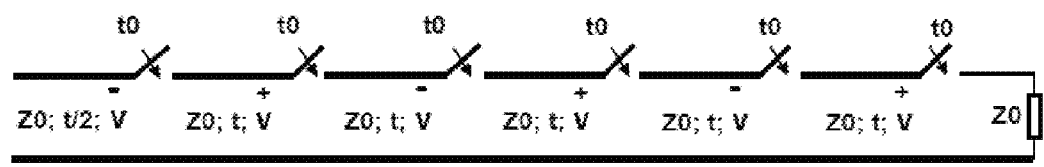
FIG. 3a illustrates a schematic diagram of an exemplary known FWG with six sections and with the switches positioned only in series with the transmission line sections.
Figure 3B:
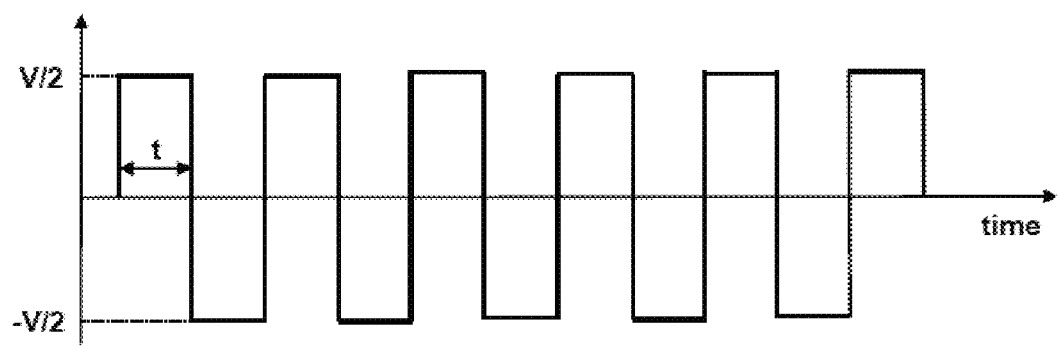
Figure 4A:
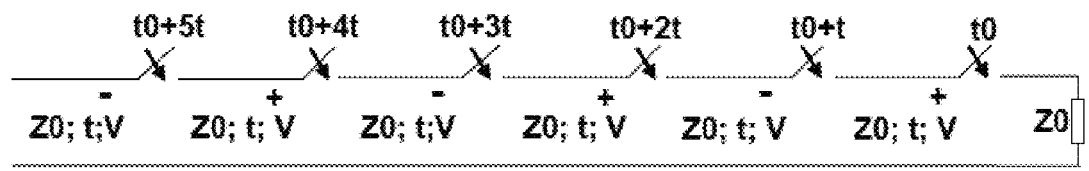
FIG. 4a illustrates a schematic diagram of an exemplary known SSG with six sections.
Figure 4B:
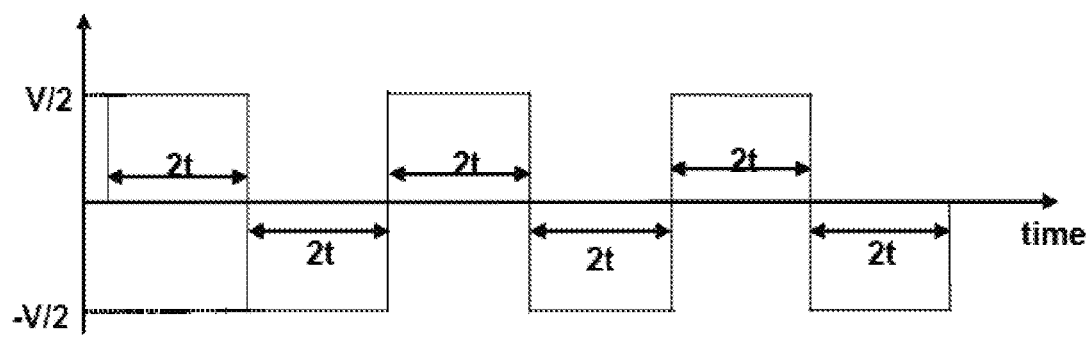
Figure 5:
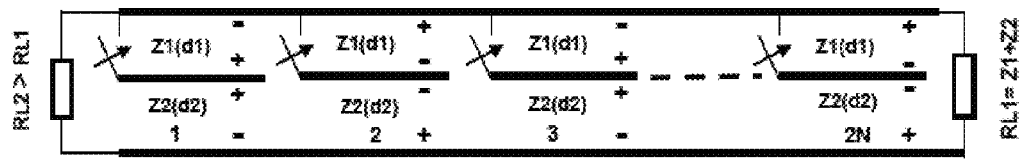
FIG. 5 illustrates an exemplary known schematic diagram of the sequential switching 2N-section pulse generator with the minimum hold-off voltage on the switches.
Figure 6:
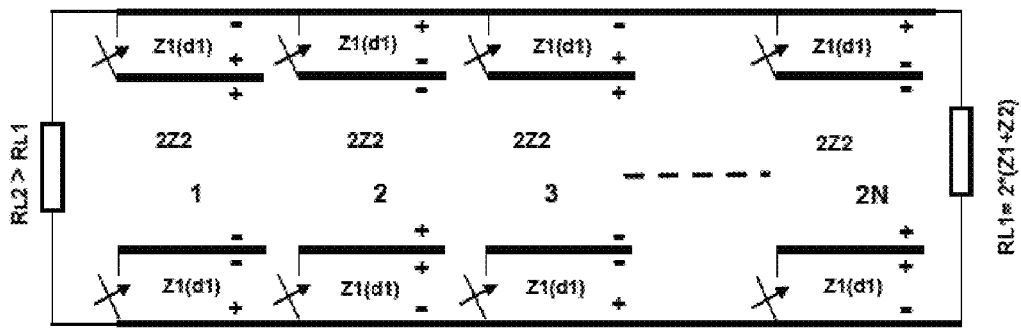
FIG. 6 illustrates an exemplary known schematic diagram of the sequential switching 2N-section balanced structure of pulse generator with the minimum hold-off voltage on the switches.
Figure 7A:
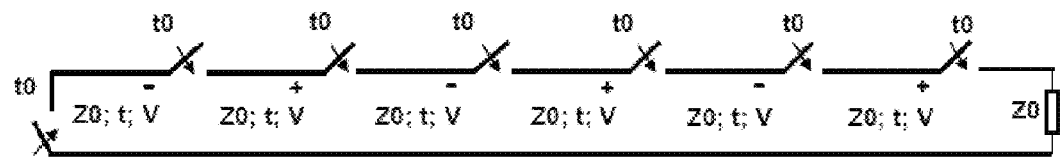
FIG. 7a illustrates a schematic diagram of an exemplary known FWG with six sections.
Figure 7B:
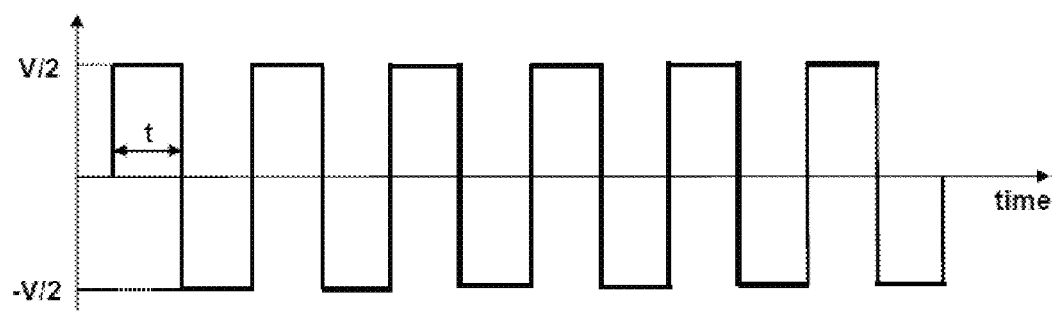
Figure 8:
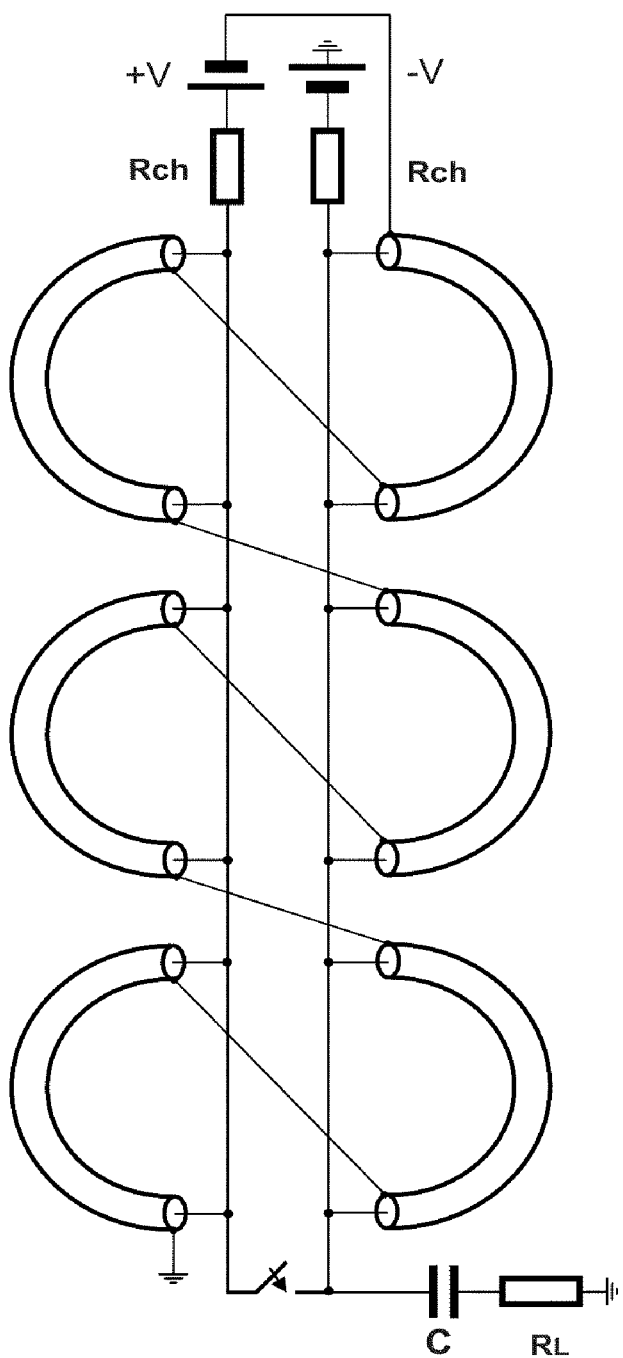
FIG. 8 illustrates a schematic/design diagram of an exemplary known three-cycle generator with a single switch.
Figure 9:
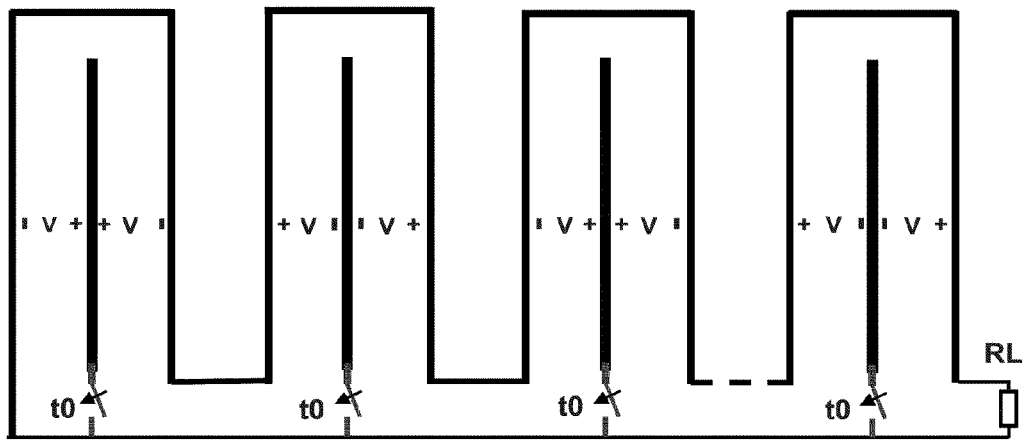
FIG. 9 is a schematic drawing of multi-cycle pulse generator according to one embodiment of the present invention.
Figure 10:
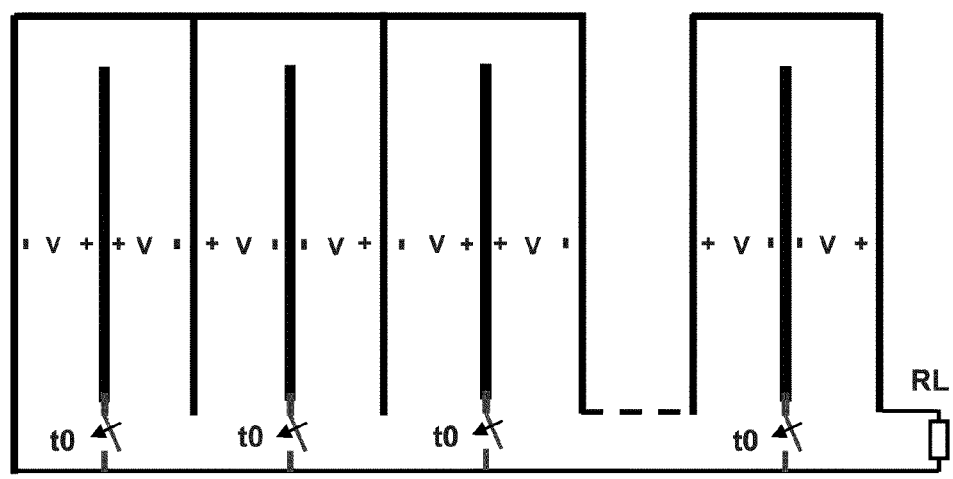
FIG. 10 is a schematic drawing of a compact multi-cycle pulse generator according to an embodiment of the present invention.

One embodiment of the present invention is illustrated in FIG. 9. In this generator, N alternately charged sections with equal characteristic impedances (the same as load impedance) provide N bipolar pulses on the load. All switches should be closed simultaneously. Also, switches with the same potential with respect to a common conductor could be connected together and replaced by a single switch in a proper design. The interconnection transmission lines between oppositely charged line sections are non-charged and should have the same impedance as the charged lines. These lines induce separation in time between bipolar pulses. Because all waves propagate inside the structure, all sections could be combined with common conductors in a very compact design without any lines between sections, as illustrated in FIG. 10.

One of the significant improvements over known multi-cycle generators is simultaneously implementing compactness, minimum hold-off voltages on switches, and a low number of switches.

Figure 11A:
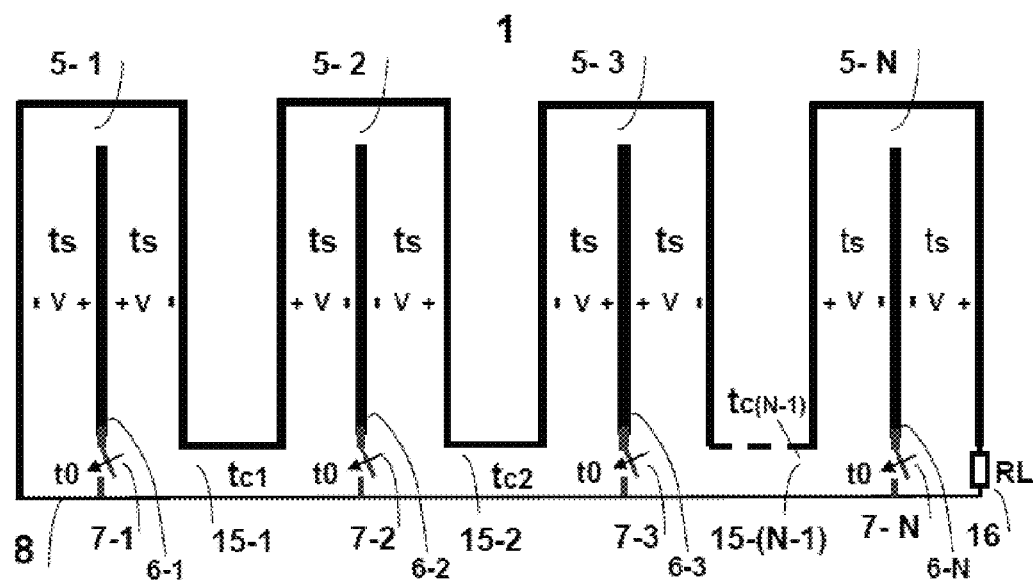
FIG. 11a illustrates a schematic/design diagram of an N-cycle generator of the present invention.
Figure 11B:
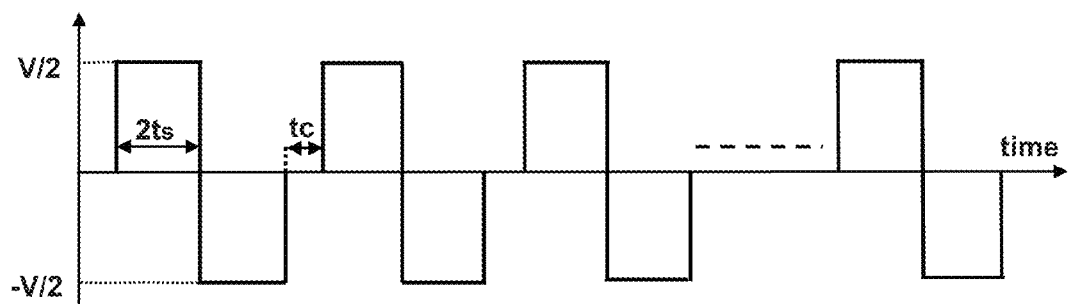
FIG. 11b shows an ideal N-cycle pulse form on the matched load of the generator according to FIG. 11a when tc1=tc2=tc3= ... =tc(N−1)=tc.

FIG. 11a illustrates a schematic/design diagram of an N-cycle HPM generator of the present invention, and FIG. 11b shows an ideal N-cycle pulse form on the matched load of the generator according to FIG. 11a when tc1=tc2=tc3= ... = tc(N−1)=tc. This illustrated embodiment comprises a novel connection of a plurality of transmission line sections and a plurality of closing switches positioned between specific conductors of each transmission-line section and a common (zero potential) conductor of the generator. This generator 1 includes N pairs of transmission lines in sections 5-1, 5-2, 5-3, ... 5-N, wherein each pair of transmission lines (section) includes two cascade (chain) connected, two-conductor transmission lines with section-specific conductors 6-1, 6-2, 6-3, ... 6-N, respectively. That is, each transmission line section 5-1, 5-2, 5-3, ... 5-N includes a first conductor 6-1, 6-2, 6-3, ... 6-N that is section-specific and a second conductor that is common to all of the sections. These common and section-specific conductors are operationally connected to the other common conductor 8. Two transmission lines in each pair could be considered as a single folded transmission line. The nearest end of each section-specific conductor 6-1, 6-2, 6-3, ... 6-N is operatively connected to the common conductor 8 of the whole generator by a corresponding switch 7-1, 7-2, 7-3, ... 7-N, respectively, that are normally engaged simultaneously at t0. All N sections 5-1, 5-2, 5-3, ... 5-N can be connected through non-charged transmission lines 15-1, 15-2, 15-3, ... 15-(N−1), respectively, each non-charged transmission line being associated with the common conductor 8. Furthermore, the first common conductor is connected at its distant end to the second common conductor 8 at the first transmission line section 5-1, and at its near end at the last transmission line section 5-N to the first terminal of load 16 (RL). The second terminal of the load 16 is connected to the common conductor 8.

Characteristic impedances of all transmission lines in sections 5-1, 5-2, 5-3, ... 5-N and characteristic impedances of all interconnected transmission lines 15-1, 15-2, ... 15-(N−1) should be equal and the same as impedance of load 16. The charged transmission lines in each section 5-1, 5-2, 5-3, ... 5-N preferably have the same electrical length ts. However, these lengths could be different for different sections: ts1, ts2, ts3, ts(N). These lengths specify widths of the generated pulses and are related with the pulse energy. The electrical lengths of the non-charged lines 15-1, 15-2, 15-3, ... 15-(N−1) can also be different, altering the specified time intervals (gaps) between the pulses tc1, tc2, tc3 ... tc(N). These gaps are not related to the energy of the pulses.

FIG. 11b illustrates the corresponding pulse train on the load 16 of one specific case when the electrical lengths of all transmission lines in sections 5-1, 5-2, 5-3, ... 5-N are equal (ts), and the electrical length of lines 15-1, 15-2, 15-3, ... 15-(N−1) are also equal (tc). In the generator according to FIG. 11a, all switches 7-1, 7-3, 7-5, etc. with the positive hold-off voltages could be connected together and incorporated into a common switch. The same is true for switches 7-2, 7-4, 7-6, etc. These switches could also be connected together and replaced by a common switch.

As a result, the multi-cycle generator presented on FIG. 11a, as compared to known generators, is compact, requiring minimum switch hold-off voltage (equal to the charging voltage), and with the number of switches equal to or less than the number of cycles.

Figure 12:
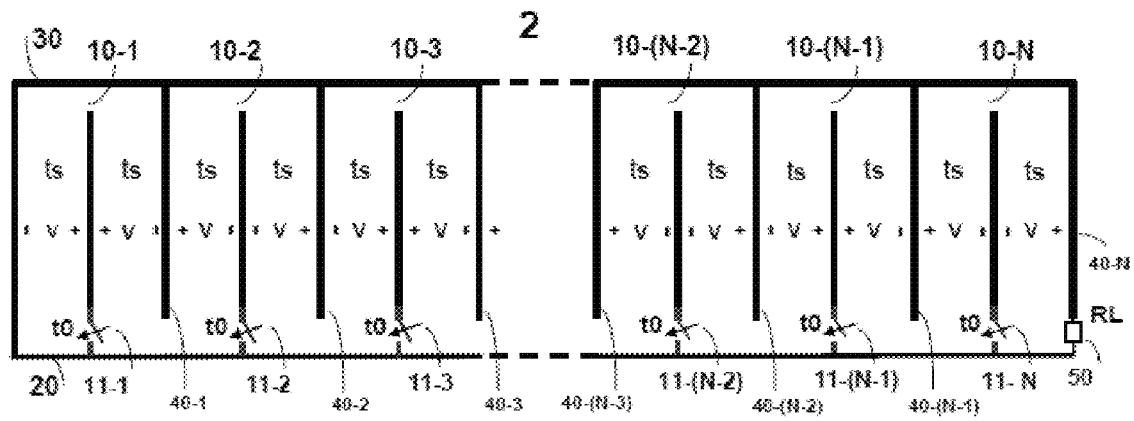
FIG. 12 illustrates a schematic/design diagram of an N-cycle generator of the present invention.
Figure 13:
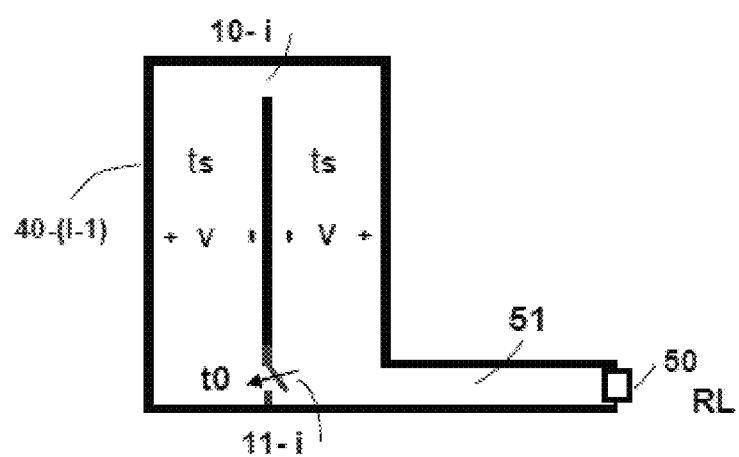
FIG. 13 illustrates a partial schematic/design diagram that illustrates the principle of operation of the generator according to FIG. 12.
Figure 14:
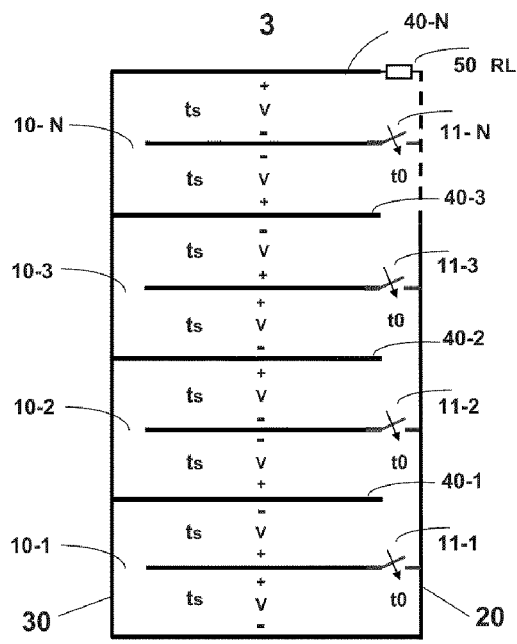
FIG. 14 illustrates a schematic/design diagram of an N-cycle generator, according to FIG. 12, rotated 90° as an option of its practical implementation.
Figure 15:
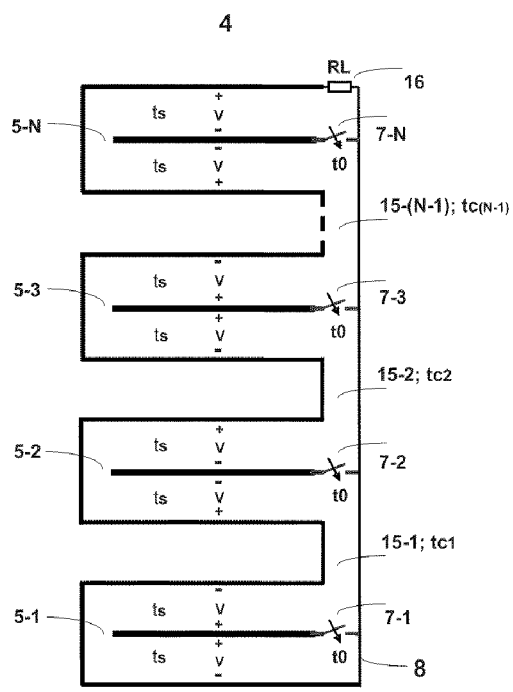
FIG. 15 illustrates a schematic/design diagram of an N-cycle generator according to FIG. 11a, rotated 90°, as an option of its practical implementation.

FIG. 12 illustrates a compact and simple version of the generator illustrated in FIG. 11a. The generator 2 of FIG. 12 is the same as shown on FIG. 11a in the case of identical charged lines in sections 10-1, 10-2, 10-3, ... 10-(N−2), 10-(N−1) and 10-N. In addition, the lengths of all non-charged lines 15-1, 15-2, 15-3, ... 15-N=0 to simplify the explanation of operation. In this case, during operation of the generator 2, after charging all N sections 10-1, 10-2, 10-3, . . . 10-(N−2), 10-(N−1), and 10-N by voltage V with sequentially reversed polarities, each conductor 40-1, 40-2, 40-3, . . . 40-(N−1) is at zero potential with respect to common conductor 20 and there is no voltage on the load 50. This means that before engaging switches 11-1, 11-2, 11-3, . . . 11-N at time t=t0, all conductors 40-1, 40-2, 40-3, . . . 40-(N−1) at their near ends may be connected to the common conductor 20. At their distal ends, all of these conductors are connected to common conductor 30. Taking this into account, consider the operation of only the last Nth section of the generator 2, which is the circuit illustrated in FIG. 13, assuming that i=N and length of line 51=0. This circuit presents a widely used single-cycle generator according to SU Patent No. 122823, 1959. During time period 4ts (double the transit time of the last section) after switching, a single-cycle (bipolar pulse) with magnitude V/2 and pulse width 4ts will be generated on the load 50. However, zero voltage on the near end of conductor 40-(N−1) exists only during time interval 2ts after switching; that is, before the reflected pulse from the load 50 (also with half the magnitude of the charging voltage) reaches the near end of conductor 40-(N−1). At that moment, the second cycle, generated by the (N−1)th section directly following the first cycle, starts to propagate through the Nth section to the load 50, as on the matched transmission line. After an additional 2ts time interval the voltage on the near end of 40-(N−2)th conductor with respect to common conductor 20 becomes non-zero, and a similar process of generating the third cycle starts by operation of the (N−2)th section. Finally, all N sections will be discharged and full energy, initially stored in all N sections, will be transferred to the load as an N-cycle pulse. As options for practical implementation, generators 1, 2 could be positioned as shown in FIGS. 14 and 15, respectively. FIG. 14 illustrates generator 2 rotated 90° as an option of its practical implementation, and FIG. 15 illustrates generator 1 rotated 90°.

Figure 16A:
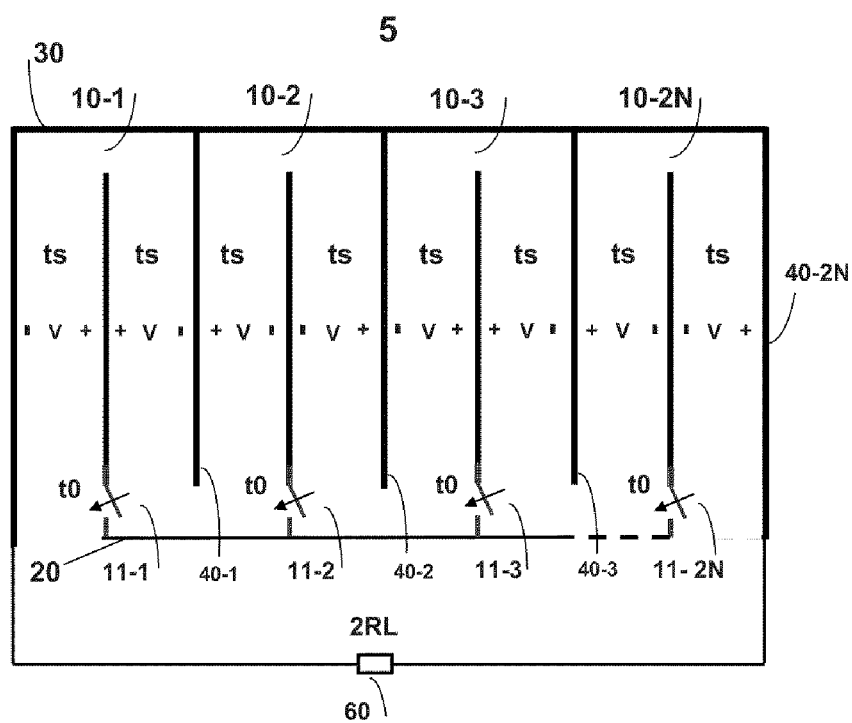
FIG. 16a illustrates a schematic/design diagram of an N-cycle generator of the present invention, having a 2N-structure similar to FIG. 12 and with a balanced load.
Figure 16B:
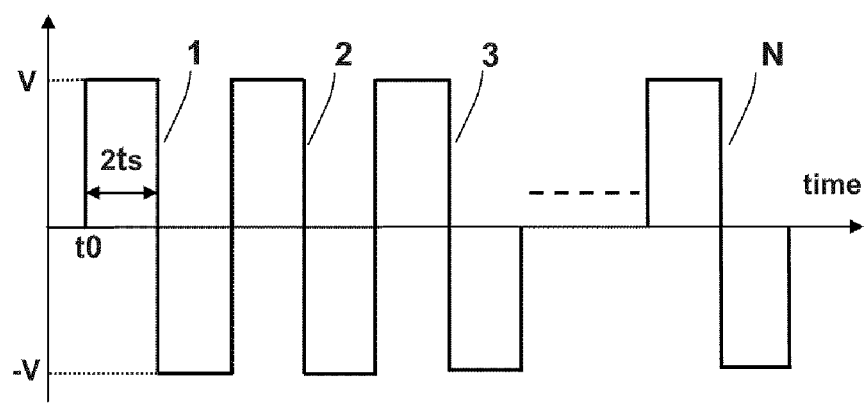
Figure 17:
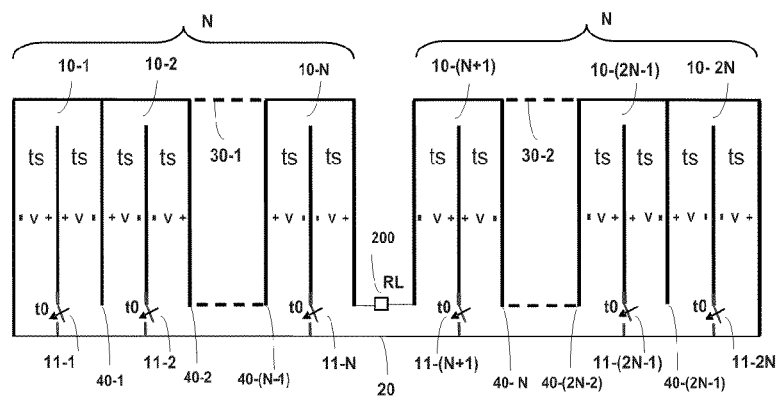
FIG. 17 illustrates a schematic/design diagram of an N-cycle generator of the present invention, having 2N-structure similar to FIG. 12 and with the balanced load, positioned at the middle of the structure.

The basic structures illustrated in FIGS. 11a and 12 can be presented with balanced loads. Two different variations for the basic structure illustrated in FIG. 12 are shown in FIG. 16a, with balanced load 60, and in FIG. 17, with balanced load 200. Similar structures are evident for the unbalanced structure illustrated in FIG. 11a. In both cases the balanced structures are combinations of two identical unbalanced structures having opposite polarities. As a result, the number of pulses is the same as for each combined unbalanced structure with double voltage on the load 60, as shown in FIG. 16b, and having twice the impedance value with respect to the load of the corresponding unbalanced structure.

Figure 18:
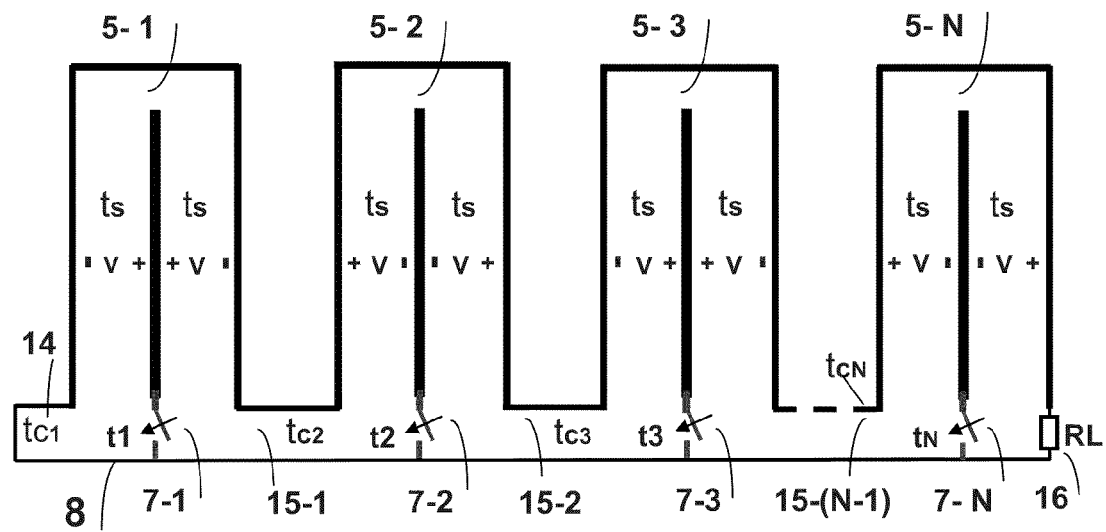
FIG. 18 illustrates a schematic/design diagram of an N-cycle generator of the present invention.
Figure 19A:
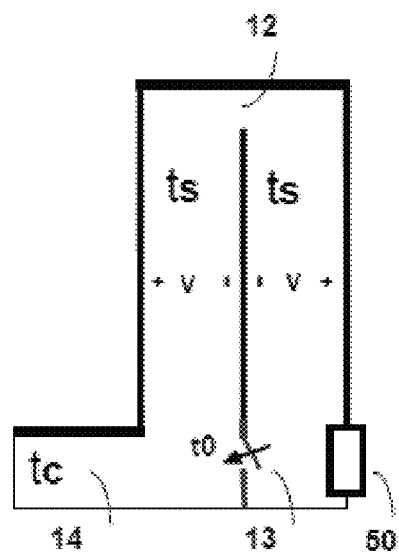
FIG. 19a illustrates a schematic/design diagram of a single-cycle generator of the present invention, having a separation between the positive and negative sub-pulses.
Figure 19B:
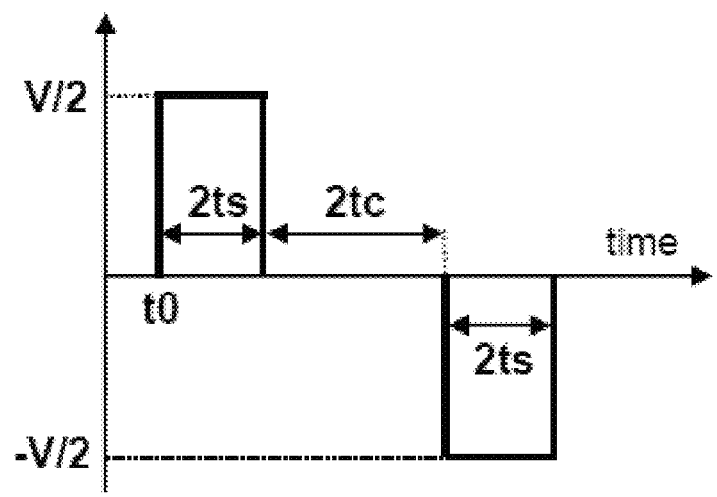

An additional freedom in the forms of the generating pulse, besides those in generator 2 of FIG. 11a with different lengths of voltage charged sections 5-1, 5-2, 5-3, . . . 5-N and different lengths of interconnected lines 15-1, 15-2, 15-3, . . . 15-(N−1), can be achieved by adding an additional non-charged transmission line 14 with the same characteristic impedance as all other lines and with electrical length tc1, connected as shown in FIG. 18. To observe the results that can be achieved by means of this extra transmission line 14, consider the simplest case illustrated in FIG. 19a. The generator illustrated here is a modified single-cycle generator according to SU Patent No. 122823. The additional line 14 provides separation between positive and negative sub-pulses without any changes in power or length of the sub-pulses as shown in FIG. 19b.

Figure 20A:
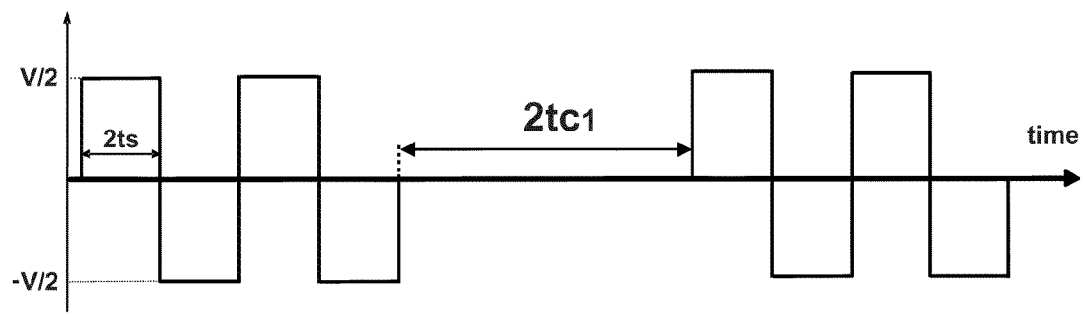
FIG. 20a illustrates a pulse form according to particular case of 4-cycle (N=4) generator of FIG. 18 when tc2=tc3=tc4=0.
Figure 20B:
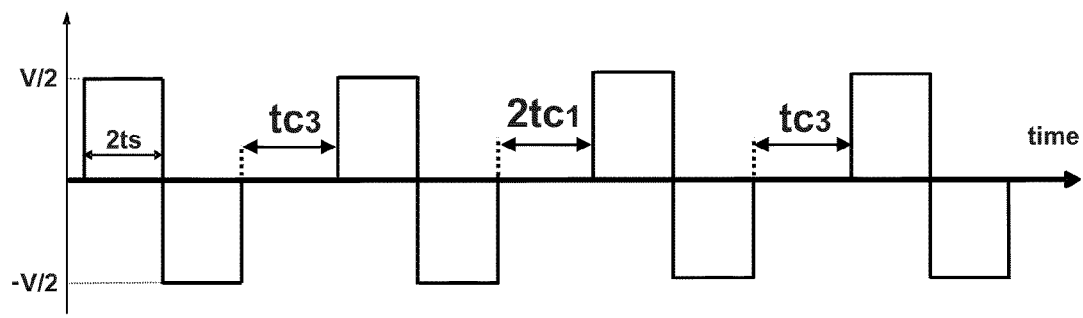
FIG. 20b illustrates a pulse form according to particular case of 4-cycle (N=4) generator of FIG. 18 when tc2=tc4=0.

FIGS. 20a and 20b illustrate two particular cases of pulses generated by the structure illustrated in FIG. 18 for N=4. For the pulse illustrated in FIG. 20a, tc2=tc3=tc4=0. For the pulse illustrated in FIG. 20b, tc2=tc4=0. As shown, the generated form is a multi-cycle bipolar pulse having separation between certain adjacent pulses. The separations can vary, and are dependent upon the lengths of the corresponding non-charged transmission lines intermediate the charged sections.

Figure 21A:
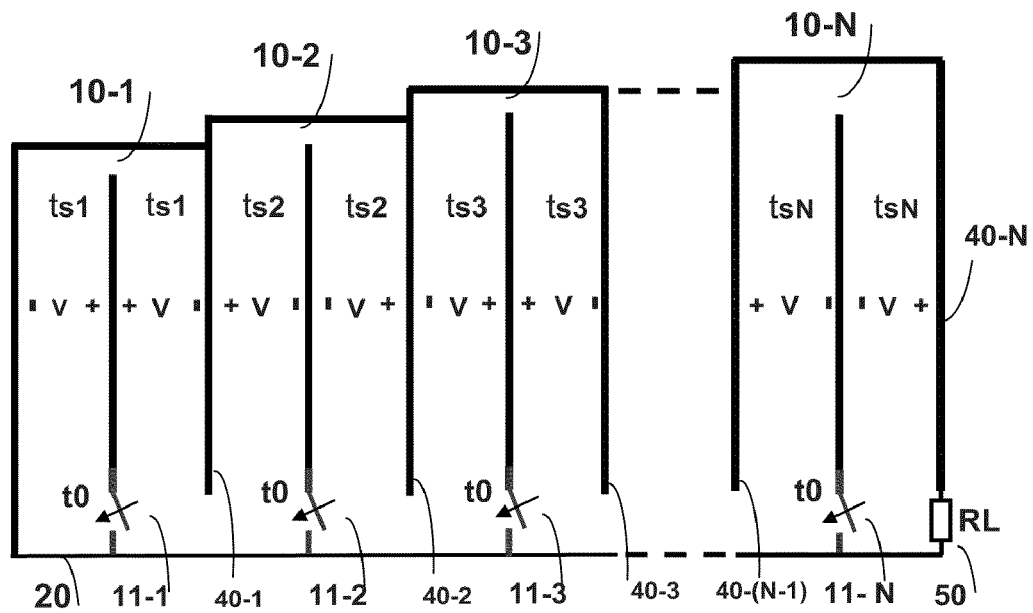
FIG. 21a illustrates a schematic/design diagram of an N-cycle generator of the present invention, having different widths of cycles.
Figure 21B:
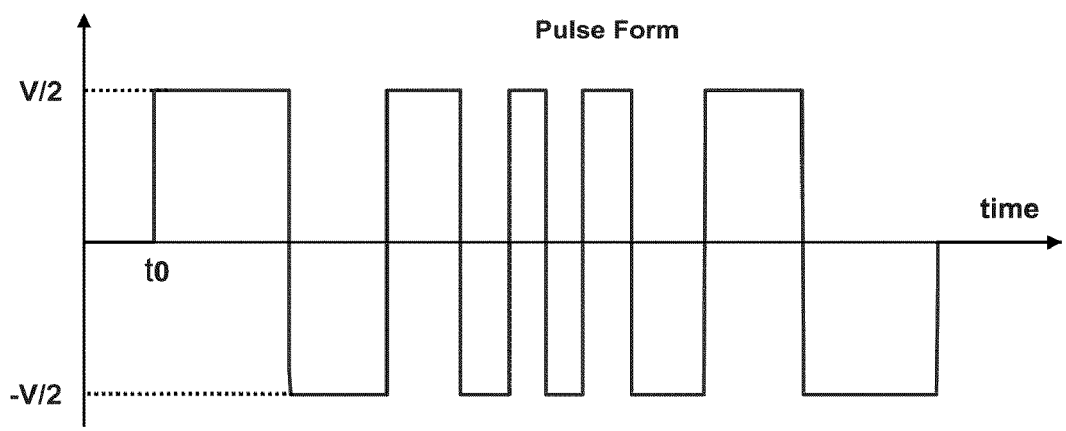
FIG. 21b illustrates a pulse form according to particular case of 4-cycle (N=4) generator of FIG. 21a when ts1<ts2<ts3<ts4.

FIG. 21a illustrates another particular case of a generator according to the present invention when charged transmission lines in sections 10-1, 10-2, 10-3, . . . 10-N are non-equal in electrical length and the lengths of all non-charged lines are zero. A corresponding pulse form for equally increased lengths of lines ts1<ts2<ts3<ts4 for N=4 is shown in FIG. 21b. As shown, the generated form is a multi-cycle bipolar pulse in which the sub-pulses have differing wavelengths.

Figure 22:
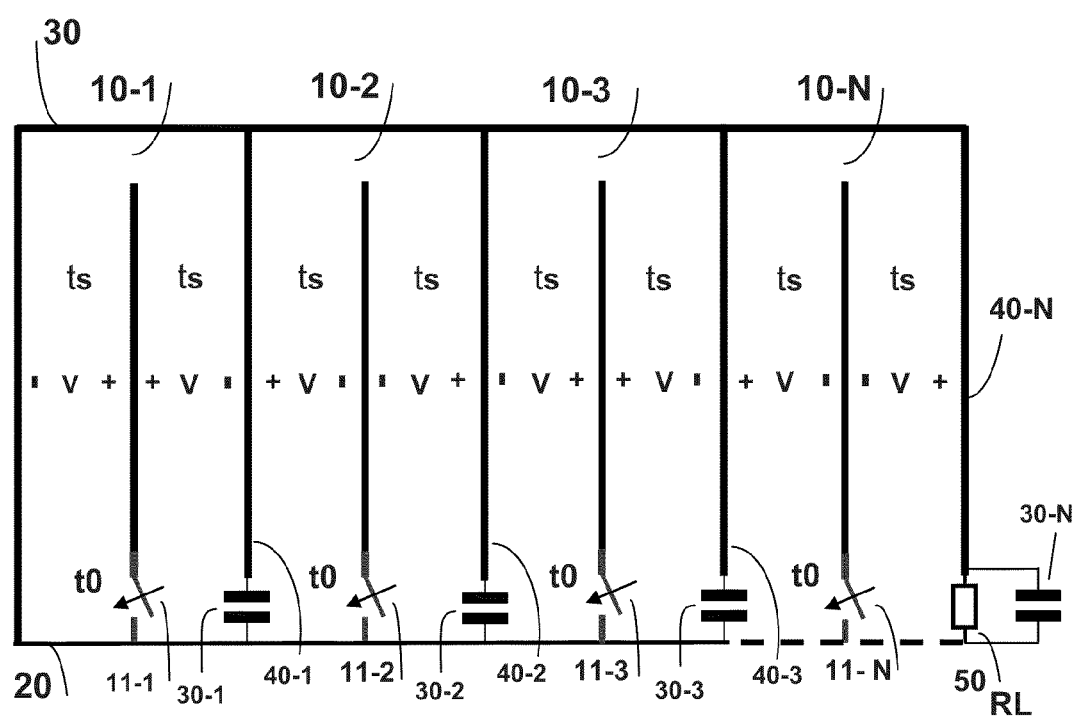
FIG. 22 illustrates a schematic/design diagram of the N-cycle generator according to FIG. 12 with the capacitive correction of the switches' inductance effect.

In many practical implementations with real parameters of switches connected in series, including those for interconnection to transmission lines, the inductance stretches the pulse. Correcting capacitors 30-1, 30-2, 30-3, . . . 30-N can be connected as illustrated in FIG. 22 to compensate for this effect, at least to some extent. FIG. 22 illustrates a schematic/design diagram of the N-cycle generator of FIG. 12 with the capacitive correction of the switches' inductance effect.

Those skilled in the art will appreciate that the compact high power multi-cycle generators of the present invention can be combined in a simple structure with the advantages of compactness, small number of switches with minimum holding voltages, and the possibility of generating high power pulse trains with a variety of frequency bandwidth.

While the preferred embodiments of the present invention have been described above and in the drawing figures, it should be understood that they have been presented by way of example only, and not of limitation. It will be apparent to persons skilled in the relevant art that various changes in form and detail can be made therein without departing from the spirit and scope of the invention. Thus the present invention should not be limited by the above-described exemplary embodiments, but should be defined only in accordance with the following claims and their equivalents. Furthermore, while certain advantages of the invention have been described herein, it is to be understood that not necessarily all such advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other advantages as may be taught or suggested herein.

What is claimed is:

1. An apparatus for generating electrical impulses, comprising:
   a plurality of charged two-conductor transmission line sections positioned sequentially, each transmission line having only two conductors and section including a first conductor that is section-specific and a second conductor that is continuous and common to all of the sections;
   a plurality of switches, each switch being operatively connected at a first end to a near end of a respective one of the first conductors;
   a third, common conductor that is not charged and is operatively connected to the near end of each of the first conductors through a second end of its respective switch; and
   a load;
   wherein the second conductor, the third conductor, and the load are operatively connected.

2. The apparatus of claim 1, wherein the number of first conductors, the number of two-conductor transmission line sections, and the number of switches are all equal.

3. The apparatus of claim 1, wherein sequentially positioned two-conductor transmission line sections interconnected by corresponding switches have opposite polarity charges.

4. The apparatus of claim 1, wherein sequentially positioned ones of the plurality of transmission line sections are operatively connected through non-charged two-conductor transmission lines that employ the second and third conductors.

5. The apparatus of claim 4, wherein each of the charged transmission line sections has a first impedance, the non-charged transmission lines have a second impedance, the load has a third impedance, and the first, second, and third impedances are substantially equal.

6. The apparatus of claim 1, wherein each of the charged two-conductor transmission line sections has substantially the same length.

7. The apparatus of claim 1, wherein the charged two-conductor transmission line sections have varied lengths to produce pulses of different lengths.

8. The apparatus of claim 1, wherein:
the load is operatively connected to a near end of the second conductor and a near end of the third conductor; and
a distant end of the second conductor is operatively connected to a distant end of the third conductor.

9. The apparatus of claim 1, wherein:
a near end of the second conductor is operatively connected to a near end of the third conductor;
a distant end of the second conductor is operatively connected to a distant end of the third conductor; and
the load is operatively connected to first and second intermediate ends of the second conductor.

10. The apparatus of claim 1, further comprising, a plurality of capacitors, each capacitor being operatively connected between the third conductor and the second conductor at interconnections between sequentially connected two-conductor transmission line sections to compensate for inductances of the switches.

11. A method of generating microwave signals, comprising:
providing an apparatus having: i) a plurality of voltage charged transmission line sections, each section including a first conductor that is section-specific and a second conductor that is common to all of the sections, ii) a plurality of switches, each switch being operatively connected to a respective one of the first conductors, iii) a third, common conductor that is not charged and is operatively connected to each of the first conductors through its respective switch, and iv) a load;
charging each of the transmission line sections with sequentially reversed polarities at the same voltage; and
closing one of the switches to generate a bipolar pulse.

12. The method of claim 11, wherein:
the providing includes providing a non-charged transmission line adjacent a first one of the plurality of charged transmission line sections; and
the closing includes closing one of the switches to generate a bipolar pulse having separation between its positive and negative sub-pulses.

13. The method of claim 11, further comprising selectively closing each of the switches to generate a multi-cycle bipolar pulse.

14. The method of claim 13, wherein all of the switches are closed at the same time.

15. The method of claim 13, wherein at least two of the switches are closed at different times.

16. The method of claim 13, wherein:
the providing includes providing non-charged transmission lines intermediate select adjacent ones of the plurality of transmission line sections; and
the closing includes closing the switches to generate a multi-cycle bipolar pulse train having separation between certain adjacent pulses.

17. The method of claim 13, wherein
the providing includes providing an apparatus having a plurality of charged transmission line sections having a plurality of lengths; and
the closing includes closing the switches to generate a multi-cycle bipolar pulse train in which the individual bipolar pulses have a plurality of wavelengths.

18. An apparatus for generating electrical impulses, comprising:
a plurality of charged transmission line sections, each section including a first conductor that is section-specific and a second conductor that is common to all of the sections;
a plurality of switches, each switch being operatively connected to a respective one of the first conductors;
a third, common conductor that is not charged and is operatively connected to each of the first conductors through its respective switch; and
a load; wherein:
the second conductor, the third conductor, and the load are operatively connected; and
adjacent ones of the plurality of transmission line sections are operatively connected through non-charged transmission lines.

19. An apparatus for generating electrical impulses, comprising:
a plurality of charged transmission line sections, each section including a first conductor that is section-specific and a second conductor that is common to all of the sections;
a plurality of switches, each switch being operatively connected to a respective one of the first conductors;
a third, common conductor that is not charged and is operatively connected to each of the first conductors through its respective switch; and
a load; wherein:
the second conductor, the third conductor, and the load are operatively connected;
a near end of the second conductor is operatively connected to a near end of the third conductor;
a distant end of the second conductor is operatively connected to a distant end of the third conductor; and
the load is operatively connected to first and second intermediate ends of the second conductor.

20. An apparatus for generating electrical impulses, comprising:
a plurality of charged transmission line sections, each section including a first conductor that is section-specific and a second conductor that is common to all of the sections;
a plurality of switches, each switch being operatively connected to a respective one of the first conductors;
a third, common conductor that is not charged and is operatively connected to each of the first conductors through its respective switch;
a load; and
a plurality of capacitors, each capacitor being operatively connected between the third conductor and the second conductor at interconnections between adjacent transmission line sections to compensate for inductances of the switches;
wherein the second conductor, the third conductor, and the load are operatively connected.

* * * * *